United States Patent
Kim

(10) Patent No.: US 10,025,517 B2
(45) Date of Patent: Jul. 17, 2018

(54) MEMORY SYSTEM

(71) Applicant: SK hynix Inc., Icheon-si, Gyeonggi-do (KR)

(72) Inventor: Tae Ho Kim, Daejeon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/611,301

(22) Filed: Jun. 1, 2017

(65) Prior Publication Data

US 2017/0351449 A1    Dec. 7, 2017

(30) Foreign Application Priority Data

Jun. 7, 2016    (KR) .................... 10-2016-0070334

(51) Int. Cl.
*G11C 7/00*    (2006.01)
*G06F 3/06*    (2006.01)

(52) U.S. Cl.
CPC .......... *G06F 3/0625* (2013.01); *G06F 3/0659* (2013.01); *G06F 3/0673* (2013.01)

(58) Field of Classification Search
CPC ..... G06F 3/0625; G06F 3/0673; G06F 3/0659
See application file for complete search history.

(56) References Cited

U.S. PATENT DOCUMENTS

| | | | |
|---|---|---|---|
| 2003/0128611 A1* | 7/2003 | Aipperspach | G06F 5/10 365/221 |
| 2015/0121000 A1* | 4/2015 | Tanzawa | G06F 3/0611 711/114 |
| 2015/0380085 A1 | 12/2015 | Park et al. | |

* cited by examiner

*Primary Examiner* — Mohammed A Bashar
(74) *Attorney, Agent, or Firm* — William Park & Associates Ltd.

(57) ABSTRACT

A memory system includes a memory apparatus including a write driver and a memory controller configured to control the memory apparatuses. The memory controller includes a command comparison circuit configured to compare word line addresses, bit line addresses, and pieces of write data of a first write command and a second write command and output a simultaneous write control signal having a first level when the bit line addresses and the pieces of write data are the same as each other and most significant bits (MSBs) of the word line addresses are different from each other and a processor configured to transfer a simultaneous write command for simultaneously operating the first write command and the second write command to the memory apparatus when the simultaneous write control signal having the first level is output from the command comparison circuit.

20 Claims, 8 Drawing Sheets

MEMORY SYSTEM

CROSS-REFERENCES TO RELATED APPLICATION

This application claims priority under 35 U.S.C. 119(a) to Korean application No. 10-2016-0070334, filed on Jun. 7, 2016, in the Korean intellectual property Office, which is incorporated by reference herein its entirety as set forth in full.

BACKGROUND

1. Technical Field

Various embodiments may generally relate to a semiconductor apparatus, and more particularly, to a memory system and controlling a write current.

2. Related Art

With regards to the demands on high capacity and low-power consumption of memory apparatuses, research on next-generation memory apparatuses having non-volatility and not having a refresh have been conducted. The next-generation memory apparatuses need to have a high integration of dynamic random access memory (DRAM), non-volatility of a flash memory, high speed of static RAM (SRAM), and the like. There are next-generation memory apparatuses which meet the requirements of being non-volatile and not having the refresh. These next-generation memory apparatuses which fulfill the requirements consist of a phase-change RAM (PRAM), a nano floating gate memory (FTGM), a polymer RAM (PoRAM), a magnetic RAM (MRAM), a ferroelectric RAM (FeRAM), and a resistive RAM (ReRAM).

SUMMARY

According to an embodiment, a memory system may be provided. The memory system may include a memory apparatus including a write driver configured to output a write current for writing data in a plurality of memory cells; and a memory controller configured to control the memory apparatus. The memory controller may include a command comparison circuit configured to compare word line addresses, bit line addresses, and pieces of write data of a first write command and a second write command received by the memory controller and output a simultaneous write control signal having a first level when the bit line addresses and the pieces of write data are the same as each other and most significant bits (MSBs) of the word line addresses are different from each other; and a processor configured to transfer a simultaneous write command for simultaneously operating the first write command and the second write command to the memory apparatus when the simultaneous write control signal having the first level is output from the command comparison circuit. The write driver may increase the write current by receiving the simultaneous write control signal having the first level and output an increased write current.

According to an embodiment, a memory system may be provided. The memory system may include a memory cell region include a plurality of bit lines, a plurality of word lines, and a column decoder coupled to central portions of the plurality of bit lines; a write driver configured to output a write current to the column decoder of the memory cell region; a control logic configured to control the write driver to write data in the memory cell region; a command comparison circuit configured to compare word line addresses, bit line addresses, and pieces of write data of a first write command and a second write command received from a host apparatus and output a simultaneous write control signal having a first level when the bit line addresses and the pieces of write data are the same as each other and most significant bits (MSBs) of the word line addresses are different from each other; and a processor configured to transfer a simultaneous write command for simultaneously operating the first write command and the second write command to the control logic when the simultaneous write control signal having the first level is output from the command comparison circuit. The write driver may increase the write current based on the simultaneous write control signal having the first level output from the command comparison circuit and output an increased write current to the column decoder.

According to an embodiment, a MAT may be provided. The MAT may include a memory cell region including a column decoder, the column decoder located between a first word line group arranged in an upper side of the column decoder and a second word line group arranged in a lower side of the column decoder, and bit lines coupled to central portions of the column decoder as well as word lines included in the first and second word line groups; and a write driver configured to output a write current to the column decoder of the memory cell region. The write driver increases the write current to the column decoder when an intersection region of a first word line, from the first word line group, and a first bit line is substantially the same distance from the column decoder as an intersection region of a second word line, from the second word line group, and the first bit line.

A resistance to the first word line from the column decoder is substantially the same as a resistance to the second word line from the column decoder. The first word line is symmetrical to the second word line on the basis of the column decoder.

The write drive comprises a voltage supply terminal; a first current source and a second current source coupled in parallel to the voltage supply terminal; and a switching element configured to electrically couple the voltage supply terminal to provide the increased write current by supplying the second current source to the first current source.

The increased write current is substantially double the first current source. A partial write current of the increased write current flows toward the first word line along the bit line and a remaining write current toward the second word line along the bit line to substantially simultaneously write data in a memory cell arranged in the intersection region of the first word line and the first bit line and a memory cell arranged in the intersection region of the second word line and the first bit line.

The switching element is configured to electrically couple the voltage supply terminal to provide the increased write current based on a simultaneous write control signal having a first level. The simultaneous write control signal has the first level when bit line addresses and pieces of the write data for the memory cell arranged in the intersection region of the first word line and the first bit line and the memory cell arranged in the intersection region of the second word line and the first bit line are the same as each other and most significant bits (MSBs) of word line address of the memory cell arranged in the intersection region of the first word line and the first bit line and the memory cell arranged in the intersection region of the second word line and the first bit line are different from each other.

DETAILED DESCRIPTION

Figure 1:
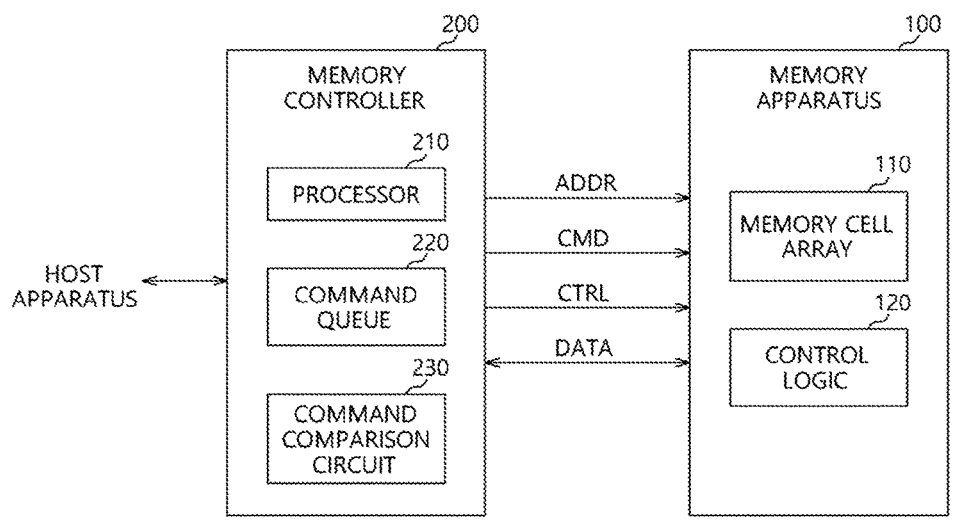
FIG. 1 is a block diagram illustrating a memory system according to an embodiment.

Examples of embodiments will be described with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The concepts are described herein with reference to cross-section and/or plan illustrations of embodiments. However, embodiments of the concepts should not be construed as limiting the concepts. Although a few embodiments of the concepts will be illustrated and described, it will be appreciated by those of ordinary skill in the art that changes may be made in these examples of embodiments without departing from the principles and spirit of the concepts.

One or more embodiments may be provided to a memory system capable of reducing write latency.

According to the embodiments, a write operation may be simultaneously performed on a plurality of memory cells coupled to one bit line, and thus the speed of the write operation may be improved and the write latency may be reduced.

Figure 2:
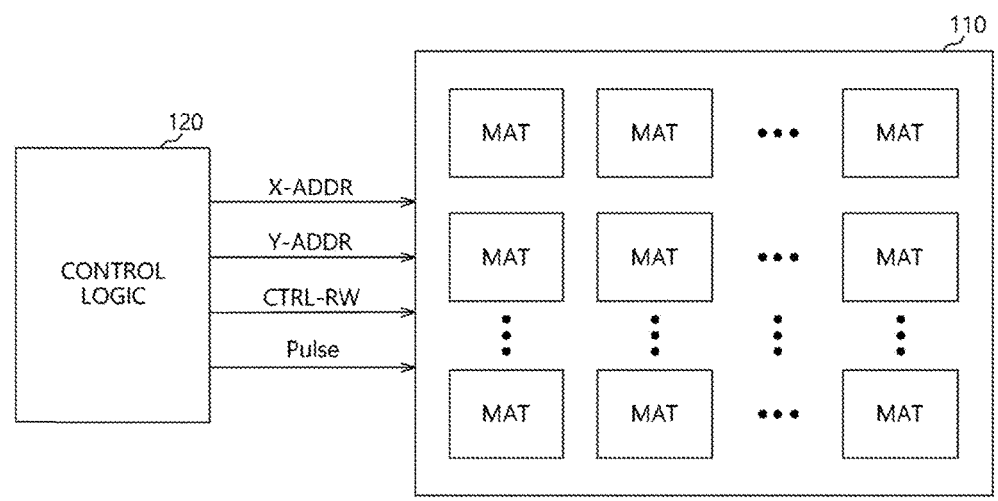
FIG. 2 is a diagram illustrating a memory apparatus of FIG. 1.
Figure 3:
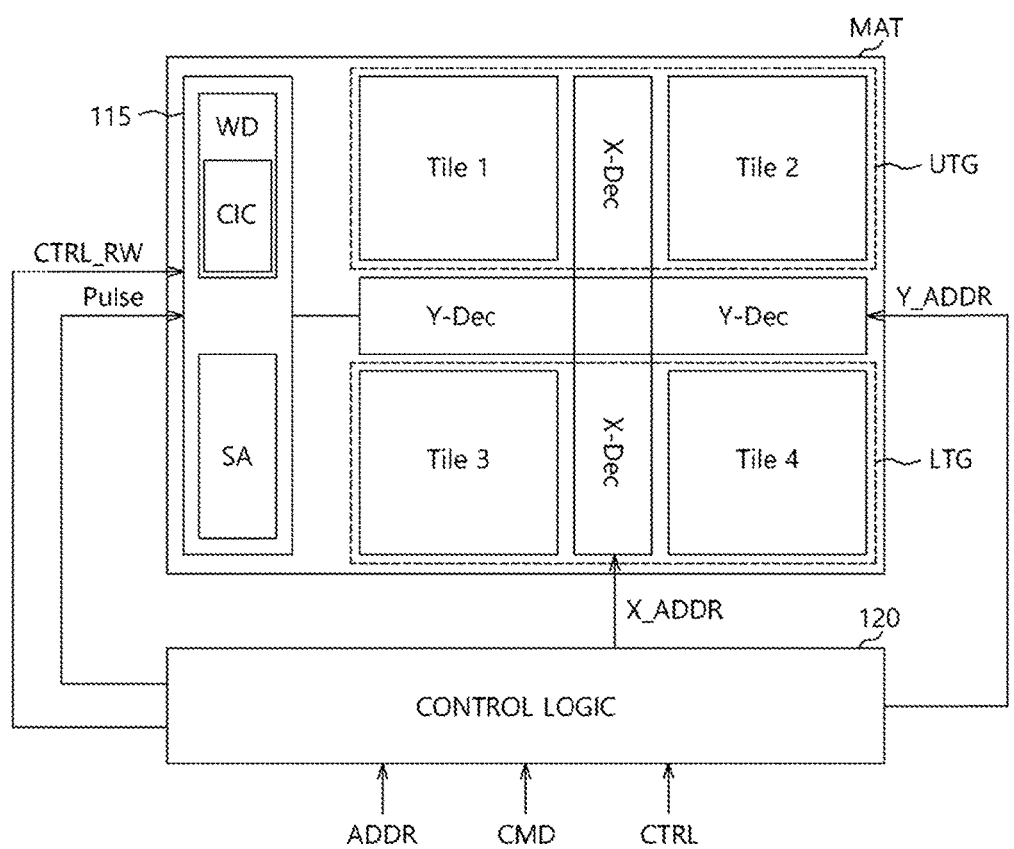
FIG. 3 is a diagram illustrating one cell region included in a memory cell array of FIG. 2.

FIG. 1 is a block diagram illustrating a memory system according to an embodiment, FIG. 2 is a diagram illustrating a memory apparatus of FIG. 1, and FIG. 3 is a diagram illustrating one cell region included in a memory cell array of FIG. 2.

Referring to FIG. 1, a memory system 10 according to an embodiment may include a memory apparatus 100 and a memory controller 200.

The memory system 10 may store data accessed by a host apparatus such as, for example but not limited to, a portable phone, a MP3 player, a laptop computer, a desktop computer, a game machine, a television (TV), or an in-vehicle infotainment system.

The memory system 10 may be fabricated with any one among various types of storage apparatuses according to a protocol of an interface coupled to the host apparatus. For example, the memory system 10 may be configured of any one among various types of storage apparatuses such as, for example but not limited to, a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, and a memory stick, and the like.

The memory system 10 may be fabricated with any one of various types of packages. For example, the memory system 10 may be fabricated with any one among various types of packages such as, for example but not limited to, a package on package (POP), a system in package (SIP), a system on chip (SOC), a multi-chip package (MCP), a chip on board (COB), a wafer-level fabricated package (WFP), and a wafer-level stack package (WSP).

The memory apparatus 100 may include a memory cell array 110 and a control logic 120.

The memory cell array 100 may include a plurality of memory cells (not illustrated) arranged at intersection regions of a plurality of word lines and a plurality of bit lines. In an embodiment, each memory cell may be a single level cell (SLC) which stores 1-bit data or a multi-level cell (MLC) which stores 2-bit data. In another example, each memory cell may be a triple level cell (TLC) which stores 3-bit data or a quad level cell (QLC) which stores 4-bit data. The memory cell array 110 may include at least one or more among the SLC, the MLC, the TLC, and the QLC.

In an embodiment, the memory cell array 110 may include the memory cells having a two-dimensional (2D) horizontal structure or a 3D vertical structure. An example that the memory cell array 110 includes the memory cells having the 2D structure will be described in the embodiments, but the embodiments are not limited thereto.

In an embodiment, the memory cell array 110 may include resistive memory cells including a variable resistor element (not illustrated) having a variable resistance. For example, when a resistance of the variable resistor element formed of a phase-change material (for example, Ge—Sb—Te (GST)) is changed according to temperature, the memory apparatus 100 may be a PRAM. When the variable resistor element includes an upper electrode, a lower electrode, and a transition metal oxide formed between the upper electrode and the lower electrode, the memory apparatus 100 may be a RRAM. When the variable resistor element includes an upper electrode formed of a magnetic material, a lower electrode formed of a magnetic material, and a dielectric formed between the upper electrode and the lower electrode, the memory apparatus 100 may be MRAM.

The memory cell array 110 may include a plurality of cell regions as illustrated in FIG. 2. Hereinafter, the cell region unit may refer to a MAT. Each MAT of the memory cell array 110 may include a plurality of tiles as illustrated in FIG. 3. Each of the plurality of tiles may include a plurality of memory cells (not illustrated).

The MAT may include a row decoder X-Dec and a column decoder Y-Dec arranged between the plurality of tiles. In an embodiment, each of the plurality of MATs may include the row decoder X-Dec arranged to extend to a first direction and the column decoder Y-Dec arranged to extend to a second direction perpendicular to the first direction. The first direction may be a direction parallel to the bit lines and the second direction may be a direction parallel to the word lines, but this is not limited thereto. The row decoder X-Dec and the column decoder Y-Dec may perpendicularly cross to each other on a plane.

The MAT may include a first tile to a fourth tile Tile 1, Tile 2, Tile 3, and Tile 4 symmetrically arranged with respect to the row decoder X-Dec and the column decoder Y-Dec. For example, the first tile Tile 1 and the third tile 3 may be symmetrically arranged with the second tile Tile 2 and the fourth tile Tile 4 with respect to the row decoder X-Dec and the first tile Tile1 and the second tile Tile 2 may be symmetrically arranged with the third tile Tile3 and the fourth tile Tile 4 with respect to the column decoder Y-Dec. The first tile Tile 1 may be diagonally arranged to the fourth tile Tile 4 and the second tile Tile 2 may be diagonally arranged to the third tile Tile 3.

It has been illustrated in FIG. 3 that one MAT includes one row decoder X-Dec and one column decoder Y-Dec, but the embodiments are not limited thereto. For example, the MAT may include two or more row decoders X-Dec arranged to the first direction and two or more column decoders Y-Dec arranged to the second direction perpendicular to the first direction. That is, the MAT may include a plurality of row decoders X-Dec arranged between the first tile Tile 1 and the second tile Tile 2 and between the third tile Tile 3 and the fourth tile Tile 4 and a plurality of column decoders Y-Dec arranged between the first tile Tile 1 and the third tile Tile 3 and between the second tile Tile 2 and the fourth tile Tile 4.

Hereinafter, the first tile Tile 1 and the second tile Tile 2 arranged in an upper side of the column decoder Y-Dec on a plane may refer to an upper tile group UTG and the third tile Tile 3 and the fourth tile Tile 4 arranged in a lower side of the column decoder Y-Dec on a plane may refer to a lower tile group LTG. The upper tile group UTG may include a plurality of memory cells arranged in an upper side on the basis of central portions of a plurality of bit lines BL0 to BL2m−1 and the lower tile group LTG may include a plurality of memory cells arranged in a lower side on the basis of the central portions of the plurality of bit lines BL0 to BL2m−1.

Figure 4:
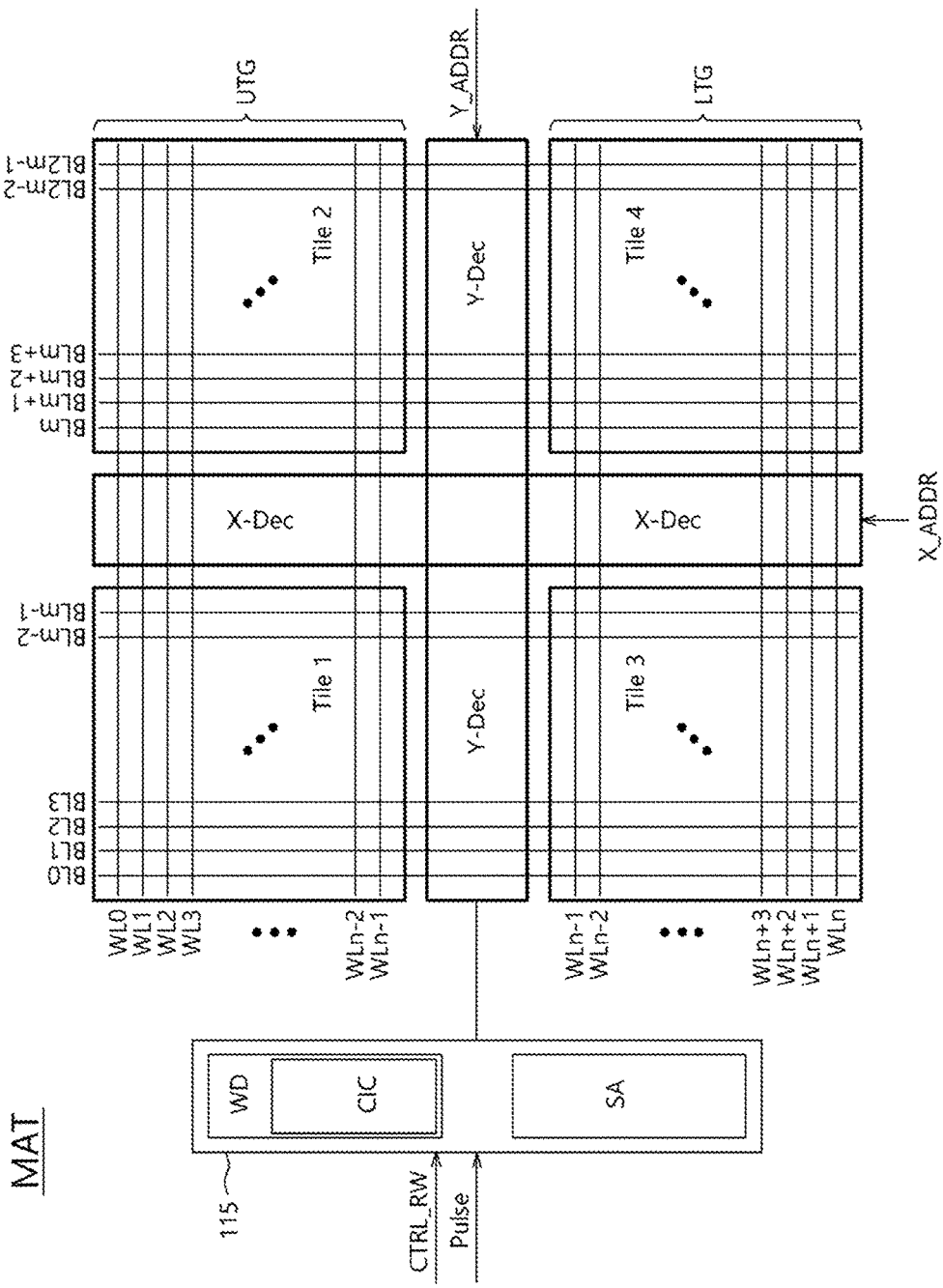
FIG. 4 is a diagram illustrating an arrangement relation of word lines, bit lines, a row decoder, and a column decoder included in one cell region according to an embodiment.

Referring to FIG. 4, the MAT may include the plurality of bit lines BL0 to BL2m−1 and a plurality of word lines WL0 to WL2n−1 which perpendicularly cross or substantially perpendicularly cross the plurality of bit lines BL0 to BL2m−1. Here, n and m may refer to an integer of 2 or more.

The plurality of bit lines BL0 to BL2m−1 may extend from the upper tile group UTG to the lower tile group LTG. The plurality of bit lines BL0 to BLm2−1 may include a plurality of first bit lines BL0 to BLm−1 which extend from the first tile Tile 1 to the third tile Tile 3 and a plurality of second bit lines BLm to BL2m−1 which extend from the second tile Tile 2 to the fourth tile Tile 4.

The plurality of word lines WL0 to WL2 n−1 may be arranged on the upper tile group UTG and the lower tile group LTG to perpendicularly cross or substantially perpendicularly cross the plurality of bit lines BL0 to BL2m−1. The plurality of word lines WL0 to WLn2−1 may include a first word line group including a plurality of word lines WL0 to WLn−1 which extend from the first tile Tile 1 to the second tile Tile 2 and a second word line group including a plurality of word lines WLn to WL2n−1 which extend from the third tile Tile 3 to the fourth tile Tile 4. The first word line group WL0 to WLn−1 may be arranged in the upper tile group UTG and the second word line group WLn to WL2n−1 may be arranged in the lower tile group LTG.

In an embodiment, the number of first bit lines BL0 to BLm−1 is equal to the number of second bit lines BLm to BL2m−1 and the number of word lines WL0 to WLn−1 included in the first word line group is equal to the number of word lines WLn to WL2n−1 included in the second word line group, but this is not limited thereto.

The row decoder X-Dec may be arranged between the first bit lines BL0 to BLm−1 and the second bit lines BLm to BL2m−1. The column decoder Y-Dec may be arranged between the first word line group WL0 to WLn−1 and the second word line group WLn to WL2n−1. That is, the column decoder Y-Dec may be arranged between the upper tile group UTG and the lower tile group LTG. For example, the row decoder X-Dec may be coupled to central portions of the plurality of word lines WL0 to WL2n−1 and the column decoder Y-Dec may be coupled to the central portions of the bit lines BL0 to BL2m−1. Accordingly, a write current (or a write voltage) may be applied to the central portions of the word lines WL0 to WL2n−1 and the central portions of the bit lines BL0 to BL2m−1, and the applied write current (or the applied write voltage) may flow toward both ends of the word lines WL0 to WL2n−1 from the central portions of the word lines WL0 to WL2n−1 and toward both ends of the bit lines BL0 to BL2m−1 from the central portions of the bit lines BL0 to BL2m−1.

For clarity, it has illustrated in FIG. 4 that the word lines WL0 to WLn−1 included in the first word line group are far away from the word lines WLn to WL2n−1 included in the second word line group and the first bit lines BL0 to BLm−1 are far away from the second bit lines BLm to BL2m−1. However, intervals between the word lines WL0 to WL2n−1 may be substantially the same and intervals between the bit lines BL0 to BL2m−1 may be substantially the same. The row decoder X-Dec and the word lines WL0 to WL2n−1 may be arranged on different layers and the column decoder Y-Dec and the bit lines BL0 to BL2m−1 may be arranged on different layers.

In an embodiment, addresses (hereinafter, referred to as first word line addresses) of the word lines WL0 to WLn−1 included in the first word line group may be arranged in reverse order to an arrangement order of addresses (hereinafter, referred to as second word line addresses) of the word lines WLn to WL2n−1 included in the second word line group, but this is not limited thereto.

For example, the first word line addresses may be arranged in ascending order and the second word line addresses may be arranged in descending order. That is, the closer to the column decoders Y-Dec, the more increased the first word line addresses and the second word line addresses may be and the farther away from the column Y-Dec, the more reduced the first word line addresses and the second word line addresses may be. Other bits of one first word line address and one second word line address which are spaced by the same distance from the column decoder Y-Dec other than the most significant bits (MSBs) may be the same as each other.

For example, when the memory cell region of one MAT includes 4K word lines, the memory cell region of one MAT may include 4096 word lines. Addresses of the 4096 word lines may be represented with '0 (zero)' to '4095'. For example, when 2048 word lines arranged in the upper side of the column decoder Y-Dec refer to the first word line group and 2048 word lines arranged in the lower side of the column decoder Y-Dec refer to the second word line group, the first word line addresses may be represented with '0 (zero)' to '2048' and the second word line addresses may be represented with '2049' to '4095'.

Since the first word addresses are arranged in ascending order as described above, an address of a first word line among the word lines in the first word line group may be '0' and an address of a last word line among the word lines in the first word line group may be '2047'. Since the second word line addresses are arranged in descending order, an address of a first word line among the word lines in the second word line group may be '4095' and an address of a last word line among the word lines in the second word line group may be '2048'.

For example, an address of a third word line among the word lines in the first word line group may be '2', and an address of a word line in the second word line group which is symmetrical with the third word line in the first word line group on the basis of the column decoder Y-Dec, that is, an address of a third word line from the last word line among the word lines in the second word line group may be '2050'. The address '2' of the third word line among the word lines in the first word line group and the address '2050' of the third word line among the word lines in the second word line group may be converted to binary number '000000000010' and '100000000010'. In an address of a word line of the first word line group and an address of a word line of the second word line group which are spaced by the same distance from the column decoder Y-Dec, the MSBs may be different from each other and other bits other than the MSBs may be the same as each other.

The MAT may include a write and read (write/read) circuit 115. The write/read circuit 115 may be coupled to the plurality of memory cells (not illustrated) through the plurality of bit lines. For example, the write/read circuit 115 may be coupled to the column decoder Y-Dec coupled to the central portions of the plurality of bit lines. The write/read circuit 115 may include a write driver WD configured to write data in the plurality of memory cells and a sense amplifier SA configured to amplify data read from the plurality of memory cells.

The write driver WD may include a current increasing circuit CIC configured to increase a write current applied to the plurality of memory cells. For example, referring to FIGS. 5A and 5B, the current increasing circuit CIC may include a first current source $I_1$ and a second current source $I_2$ coupled to a voltage supply terminal Vpp. The first current source $I_1$ and the second current source $I_2$ may be coupled in parallel to each other. The current increasing circuit CIC may include a switching element S which electrically couples the voltage supply terminal Vpp and the second current source $I_2$. The switching element S may include a transistor, but this is not limited thereto. The switching element S may be turned on/off according to a simultaneous write control signal CTRL_RW input from the memory controller 200.

For example, when the simultaneous write control signal CTRL_RW having a first level is input from the memory controller 200, the switching element S is turned on and a write current $I_{WRT}$ may flow in the $I_1$ and a second current source $I_2$. Accordingly, the write drive WD may output the doubled write current $2I_{WRT}$ which is increased twice more than the original write current $I_{WRT}$.

When the simultaneous write control signal CTRL_RW having a second level is input from the memory controller 200, the switching element S is turned off and the write current $I_{WRT}$ may flow only through the first current $I_1$. Accordingly, the write driver WD may output the original write current $I_{WRT}$ which is not increased. The first level may be a high level, that is, '1' and the second level may be a low level, that is, '0', but is the embodiments are not limited thereto.

Figure 5A:
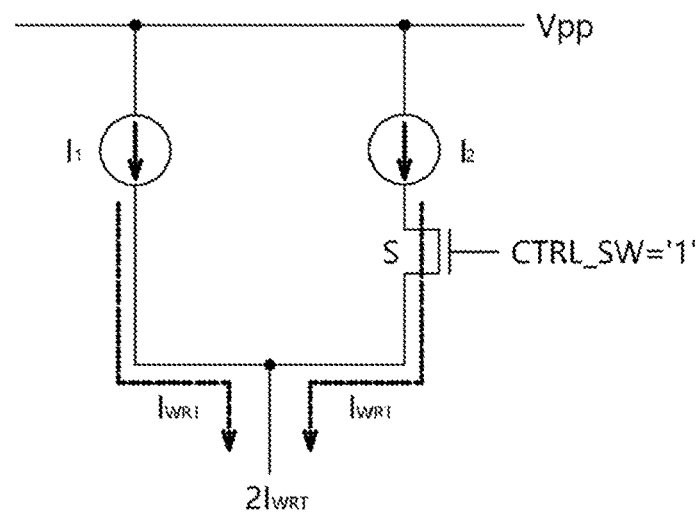
FIGS. 5A and 5B are diagrams illustrating an operation example of a current increasing circuit included in a write driver of FIG. 3.
Figure 5B:
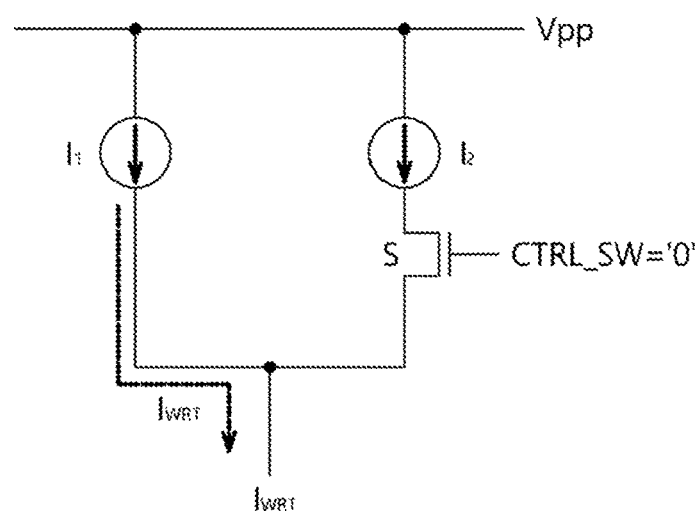

That is, the write driver WD may output the doubled write current by increasing the write current when a write operation is simultaneously performed on two or more memory cells sharing one bit line and output the original write current when the write operation is performed on one memory cell. When the plurality of memory cells are a resistive memory cell, the write current may include a reset current and a set current. The current increasing current CIC as illustrated in FIGS. 5A and 5B is merely an example and may be implemented with various configurations.

The control logic 120 may control an overall operation of the memory apparatus 100. For example, the control logic 120 may control the write/read circuit 115 to perform the memory operation such as write, read, and the like. Referring to FIGS. 2 and 3, for the write operation, the read operation, and the like of the memory apparatus 100, the control logic 120 may provide various pulse signals Pulse such as a write pulse, a read pulse, and the like to the write/read circuit 115. The write/read circuit 115 may receive the various pulse signals Pulse and provide the write current (or the write voltage) or a read current (or a read voltage) to the memory cell array 110 using the various pulse signals. A pulse generator (not illustrated) configured to generate the various pulse signals may be provided in the inside or the outside of the control logic 120.

The control logic 120 may output various internal control signals CTRL_RW for writing data in the memory cell array 110 or reading data from the memory cell array 110 to the write/read circuit 115 based on a command CMD, an address ADDR, and a control signal CTRL received from the memory controller 200.

The control logic 120 may output a row address X_ADDR for selecting a word line and a column address Y-ADDR for selecting a bit line to the row decoder X-Dec and the column decoder Y-Dec based on the address ADDR received from the memory controller 200.

Referring back to FIG. 1, the memory controller 200 may control the memory apparatus 100 to read data stored in the memory apparatus 100 or write data in the memory apparatus 100 in response to a write/read request from a host apparatus. For example, the memory controller 200 may provide the address ADDR, the command CMD, and the control signal CTRL to the memory apparatus 100 and may control the write operation (or a program operation), a read operation, and an erase operation of the memory apparatus 100. Data DATA to be written in the memory apparatus 100 and data DATA read from the memory apparatus 100 may be exchanged between the memory controller 200 and the memory apparatus 100.

The memory controller 200 may include a processor 210, a command queue 220, and a command comparison circuit 230. Although not illustrated in FIG. 1, the memory controller 200 may further include a RAM, a host interface configured to perform data exchange between a host apparatus and the memory controller 200, and a memory interface configured to perform data exchange between the memory controller 200 and the memory apparatus 100.

The processor 210 may control an overall operation of the memory controller 200.

The command queue 220 may include a space for storing a plurality of commands and a plurality of addresses. The command queue 220 may perform queuing on the command and address received from the host apparatus in receiving order.

The command comparison circuit 230 may output a result value of determining whether or not write commands for simultaneously performing the write operation are presented by comparing a plurality of write commands queued in the command queue 220. In an embodiment, the command comparison circuit 230 may compare the write commands by selecting at least two write commands among the plurality of write commands queued in the command queue 220 in queued order, but is the embodiments are not limited thereto. The command comparison circuit 230 may compare the write commands by randomly selecting two write commands.

For example, the command comparison circuit 230 may compare word line addresses, bit line addresses, and pieces of write data for the plurality of write commands queued in the command queue 220 and output the result value of determining whether or not the write commands which can be simultaneously performed or substantially simultaneously performed are presented.

Figure 6A:
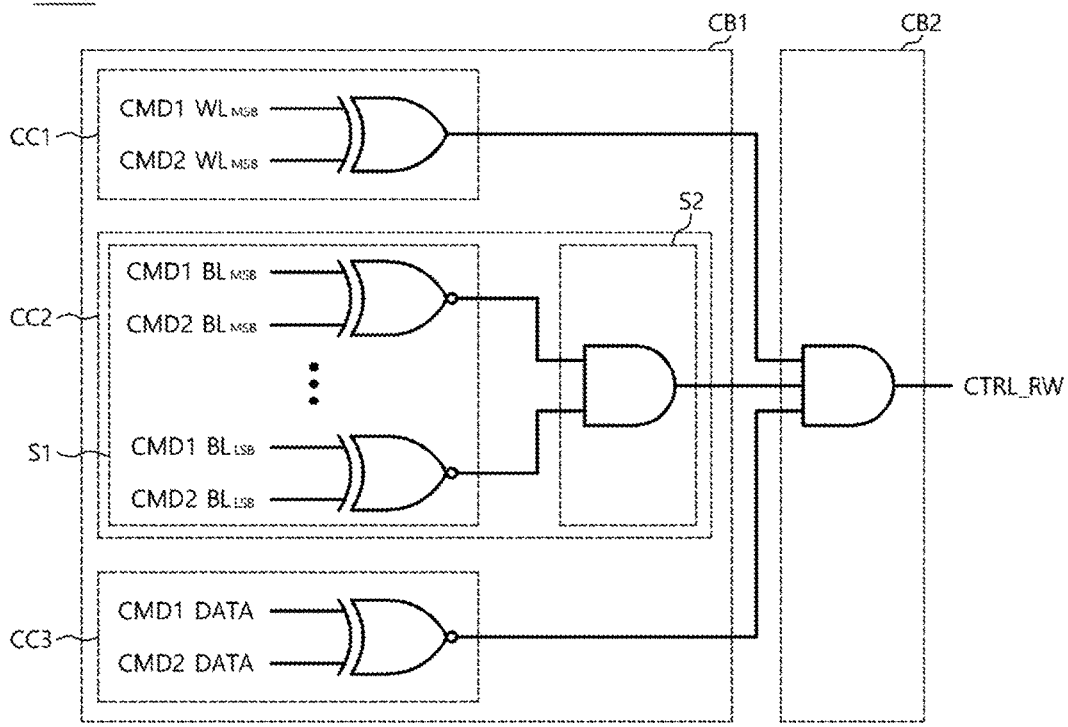
FIG. 6A is a diagram illustrating an example of a command comparison circuit of FIG. 1.

Referring to FIG. 6A, the command comparison circuit 230 may include a first comparison operation block CB1 and a second comparison operation block CB2. The first comparison operation block CB1 may include a first comparison circuit CC1, a second comparison circuit CC2, and a third comparison circuit CC3.

The first comparison circuit CC1 may include a logic gate configured to perform a logic operation on a MSB $WL_{MSB}$ of a word line address for a first write command CMD1 and a MSB $WL_{MSB}$ of a word line address for a second write command CMD2. That is, the first comparison circuit CC1 may output a result value of determining whether the MSB of the word line address for the first write command CMD1 is the same as or is different from the MSB of the word line address for the second write command CMD2 only by comparing the MSB of the word line address for the first write command CMD1 and the MSB of the word line address for the second write command CMD2. In an embodiment, for example, $WL_{MSB}$ may be a most significant bit of the word line address and $WL_{LSB}$ may be a least significant bit of the word line address etc.

Figure 6B:
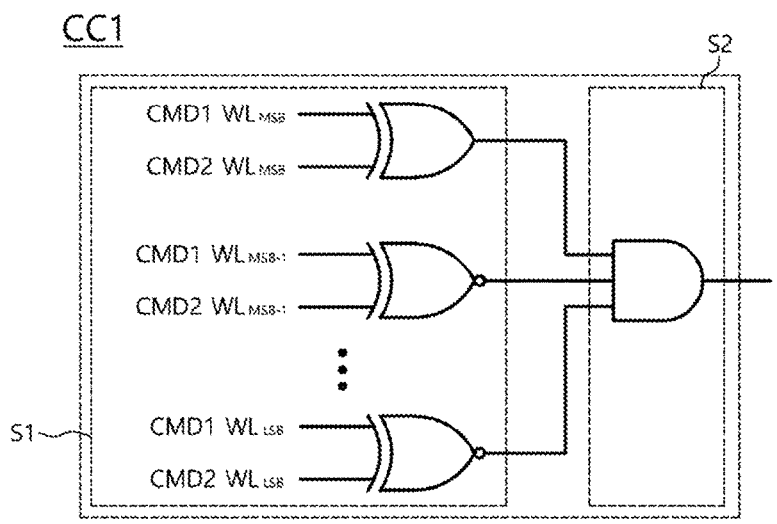
FIG. 6B is a diagram illustrating an example of a first comparison circuit of FIG. 6A.

Referring to FIG. 6B, the first comparison circuit CC1 may further include logic gates configured to perform logic operations on other bits $WL_{MSB-1}$ to $WL_{LSB}$ other than the MSB $WL_{MSB}$ of the word line address for the first write command CMD1 and other bits $WL_{MSB-1}$ to $WL_{LSB}$ other than the MSB $WL_{MSB}$ of the word line address for the second write command CMD2. That is, the first comparison circuit CC1 illustrated in FIG. 6B may output the result value of determining whether all bits of the word line address for the first write command CMD1 are the same as or are different from all bits of the word line address for the second write command CMD2 by comparing all the bits of the word line address for the first write command CMD1 and all the bits of the word line address for the second write command CMD2.

Referring back to FIG. 6A, the second comparison circuit CC2 may include a first stage S1 including a plurality of logic gates configured to perform logic operations on a MSB $BL_{MSB}$ to a least significant bit (LSB) $BL_{MSB}$ of a bit line address for the first write command CMD1 and a MSB $BL_{MSB}$ to a LSB $BL_{MSB}$ of a bit line address for the second write command CMD2 and a second stage S2 including a logic gate configured to perform a logic operation on operation results of the logic gates in the first stage S1. That is, the second comparison circuit CC2 may output the result value of determining whether all bits of the bit line address for the first write command CMD1 are the same as or are different from all bits of the bit line address for the second write command CMD2 by comparing all the bits of the bit line address for the first write command CMD1 and all the bits of the bit line address for the second write command CMD2.

The third comparison circuit CC3 may include a logic gate configured to perform a logic operation on the write data for the first write command CMD1 and the write data for the second write command CMD2. That is, the third comparison circuit CC3 may output a result value of determining whether the write data for the first write command CMD1 is the same as or is different from the write data for the second write command CMD2 by comparing the write data for the first write command CMD1 and the write data for the second write command CMD2.

The second comparison operation block CB2 may include a logic gate configured to perform a logic operation on the result values output from the first comparison circuit CC1, the second comparison circuit CC2, and the third comparison circuit CC3.

In an embodiment, the first comparison circuit CC1 may include an exclusive OR (XOR) gate, the first stage S1 of the second comparison circuit CC2 and the third comparison circuit CC3 may include an exclusive NOR (XNOR) gate, and the second stage S2 of the second comparison circuit CC2 and the second comparison operation block CB2 may include an AND gate, but this is not limited thereto.

In an example, the first comparison circuit CC1 may include an XOR gate configured to perform a logic operation on the MSB $WL_{MSB}$ of the word line address for the first write command CMD1 and the MSB $WL_{MSB}$ of the word line address for the second write command CMD2 and XNOR gates configured to perform logic operations on other bits $WL_{MSB-1}$ to $WL_{LSB}$ other than the MSB $WL_{MSB}$ of the word line address for the first write command CMD1 and other bits $WL_{MSB-1}$ to $WL_{LSB}$ other than the MSB $WL_{MSB}$ of the word line address for the second write command CMD2.

For example, the command comparison circuit 230 including the first comparison circuit CC1 illustrated in FIG. 6A may output the simultaneous write control signal CRTL_RW having a value (that is, the first level) indicating that the write operation can be simultaneously performed when the bit line address of the first write command CMD1 is the same as the bit line address of the second write command CMD2, the write data of the first write command CMD1 is the same as the write data of the second write command CMD2, and the MSB of the word line address of the first write command CMD1 is different from the MSB of the word line address of the second write command CMD2. In this example, the write operations corresponding to the first write command CMD1 and the second write command CMD2 may be simultaneously performed even when the other bits other than the MSB of the word line address of the first write command CMD1 are not the same as the other bits other than the MSB of the word line address of the second write command CMD2.

For example, the command comparison circuit 230 including the first comparison circuit CC1 illustrated in FIG. 6B may output the simultaneous write control signal CRTL_RW having a value (that is, the first level) indicating that the write operation can be simultaneously performed when the bit line address of the first write command CMD1 is the same as the bit line address of the second write command CMD2, the write data of the first write command CMD1 is the same as the write data of the second write command CMD2, the MSB of the word line address of the first write command CMD1 is different from the MSB of the word line address of the second write command CMD2, and the other bits other than the MSB of the word line address of the first write command CMD1 are the same as the other bits other than the MSB of the word line address of the second write command CMD2. In this example, the write operations corresponding to the first write command CMD1 and the second write command CMD2 may be simultaneously performed only when the MSB of the word line address of the first write command CMD1 is different from the MSB of the word line address of the second write command CMD2, and the other bits other than the MSB of the word line address of the first write command CMD1 are the same as the other bits other than the MSB of the word line address of the second write command CMD2.

The command comparison circuit 230 may compare the word line addresses, the bit line addresses, and the pieces of write data for two write commands (that is, the first write command and the second write command) among the plurality of write commands queued in the command queue 220 and output the simultaneous write control signal CTRL_RW of the first level (that is, a high level) when the first write command and the second write command are commands which can be simultaneously performed and output the simultaneous write control signal CTRL_RW of the second level (that is, a low level) when the first write command and the second write command are commands which cannot be simultaneously performed.

Figure 7:
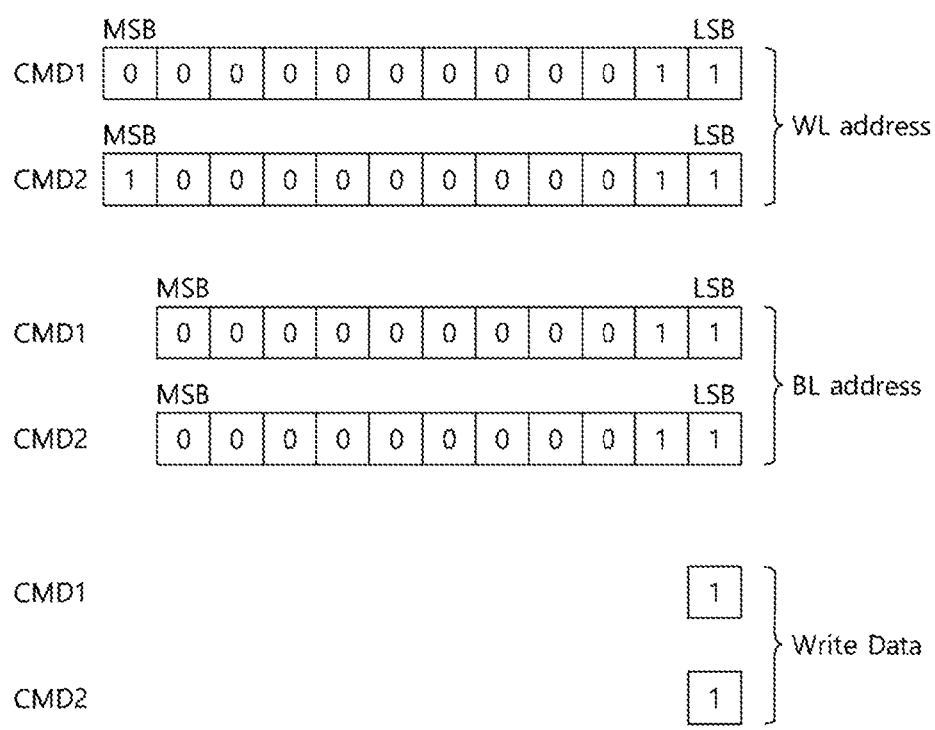
FIG. 7 is a diagram illustrating an example of two write commands of which bit line addresses and pieces of write data are the same as each other and MSBs of word line addresses are different from each other according to an embodiment.

The first write command CMD1 and the second write command CMD2 that the MSBs of the word line addresses are different from each other and the bit line addresses and the pieces of write data are the same as each other are illustrated in FIG. 7. It may be assumed that other bits other than the MSB of the word line address of the first write command CMD1 are the same as other bits other than the MSB of the word line address of the second write command CMD2. An operation of the command comparison circuit 230 which compares the first write command CMD1 and the second write command CMD2 and output a result value for the comparison will be described with reference to FIG. 7. Hereinafter, the command comparison circuit 230 including the first comparison circuit CC1 of FIG. 6A will be described for example, but the command comparison circuit 230 including the first comparison circuit CC1 of FIG. 6B may be operated in the same manner as the operation illustrated in FIG. 7.

Since the MSB $WL_{MSB}$ of the word line address for the first write command CMD1 is different from the MSB $WL_{MSB}$ of the word line address for the second write command CMD2, the first comparison circuit CC1 including the XOR gate may output a logic value ('1') of the first level.

Since all the bits of the bit line address for the first write command CMD1 are the same as all the bits of the bit line address for the second write command CMD2, the first stage S1 of the second comparison circuit CC2 including the XNOR gates may output a plurality of logic values ('1') of the first level. The second stage S2 of the second comparison circuit CC2 including the AND gate may output a logic value ('1') of the first level.

Since the write data for the first write command CMD1 is the same as the write data for the second write command CMD2, the third comparison circuit CC3 including the XNOR gate may output a logic value ('1') of the first level.

Since the output values of the first comparison circuit CC1, the second comparison circuit CC2, and the third comparison circuit CC3 have all the logic value ('1') of the first level, the second comparison operation block CB2 including the AND gate may output the simultaneous write control signal CTRL_RW of the first level.

As described above, the simultaneous write control signal CTRL_RW output from the command comparison circuit 230 may be input to the write driver WD. For example, the simultaneous write control signal CTRL_RW output from the command comparison circuit 230 may be input to the switching element S coupled to one current source (for example, the second current source $I_2$) among the current sources coupled in parallel in the current increasing circuit CIC of the write driver WD and thus the switching element S may be turned on or turned off. When the simultaneous write control signal CTRL_RW of the first level is input, the switching element S may be turned on and the write driver WD may output the doubled write current $2I_{WRT}$, which is increased twice more than the original current $I_{WRT}$, to the column decoder Y-Dec.

The processor 210 may transmit a simultaneous write command for simultaneously performing the write operation on two memory cells to the memory apparatus 100 based on the simultaneous write control signal CTRL_RW output from the command comparison circuit 230. The simultaneous write command may include addresses and pieces of write data for the two memory cells on which the write operation is to be simultaneously performed or substantially simultaneously performed.

For example, when the simultaneous write control signal CTRL_RW of the second level is output from the command comparison circuit 230, the processor 210 may determine that the first write command CMD1 and the second write command CDM2 may not be simultaneously performed and the commands queued in the command queue 220 may be sequentially transmitted to the memory apparatus 100.

When the simultaneous write control signal CTRL_RW of the first level is output from the command comparison circuit 230, the processor 210 may determine that the first write command CMD1 and the second write command CMD2 may be simultaneously performed and may transmit the simultaneous write command including all the word line addresses, the bit line addresses, and the pieces of write data for the first write command CMD1 and the second write command CMD2 to the memory command 100.

For example, the processor 210 may transmit the common bit line address and the command write data for the first write command CMD1 and the second write command CMD2 and two word line addresses for the first write command CMD1 and the second write command CMD2 to the memory apparatus 100.

In this example, when the MSB and the other bits of the word line address of the first write command CMD1 are different from the MSB and the other bits of the word line address of the second write command CDM2, the processor 201 may transmit both the word line address of the first write command CMD1 and the word line address of the second write command CMD2 to the memory apparatus 100.

When the other bits other than the MSB of the word line address of the first write command CMD1 are the same as the other bits other than the MSB of the word line address of the second write command CDM2, the processor 210 may transmit the word line address, the bit line address, and the write data of the first write command CMD1 (or the second write command CMD2) and a value of the MSB of the word line address of the second write command CMD2 (or the first write command CMD1) to the memory apparatus 100, but the embodiments are not limited thereto.

Figure 8:
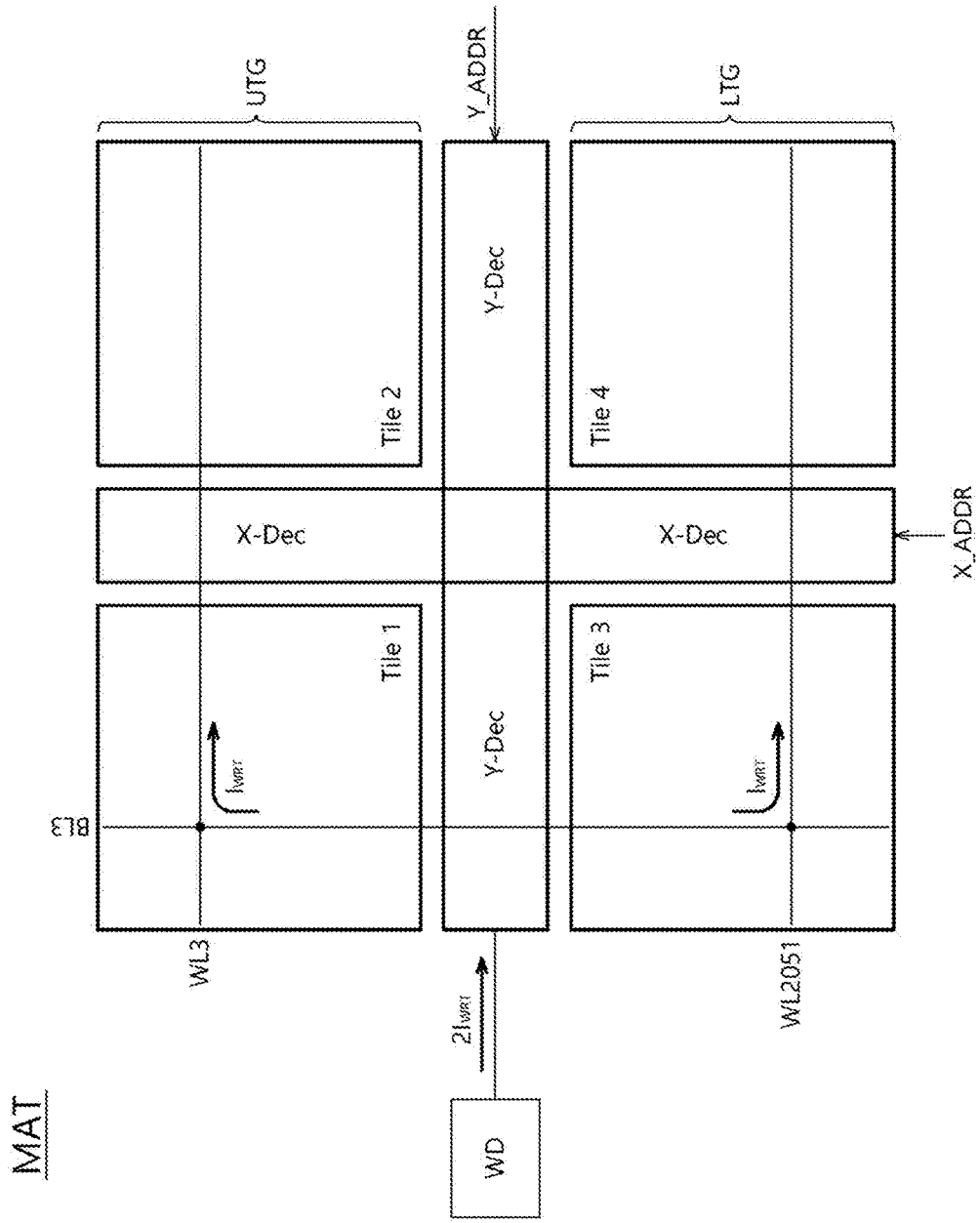
FIG. 8 is a diagram illustrating an example that write operations on the two write commands of FIG. 7 are simultaneously performed.

Referring to FIGS. 3 and 8, the control logic 120 of the memory apparatus 100 may output the column address Y_ADDR for selecting a common bit line and a row address X_ADDR for selecting two word lines to the row decoder X-Dec and the column decoder Y-Dec based on a common bit line address (for example, 'BL3'), common write data (for example, '1'), and two word line addresses (for example, 'WL3' and 'WL2051') for the simultaneous write command received from the memory controller 200. When the bit line BL3 is selected through the column decoder Y-Dec and the word lines WL3 and WL2051 are selected through the row decoder X-Dec, one bit line BL3 and two word lines WL3 and WL2051 sharing the one bit line BL3 may be enabled. The enabled two word lines WL3 and WL2051 may be arranged in the upper tile group UTG and the lower tile group LTG, respectively.

As the simultaneous write control signal CTRL_RW of the first level is input to the switching element S of the write driver WD and thus the switching element S is turned on, the write driver WD may output the doubled write current $2I_{WRT}$ to the column decoder Y-Dec.

As described above, since one word line WL3 in the upper tile group UTG is enabled and one word line WL2051 in the lower tile group LTG is enabled, the doubled write current $2I_{WRT}$ output from the write driver WD may be distributed to the upper tile group UTG and the lower tile group LTG in the column decoder Y-Dec.

That is, since two word lines WL3 and WL2051 are enabled and a resistance to the word line WL3 from the column decoder Y-Dec is substantially the same as a resistance to the word line WL2051 from the column decoder Y-Dec, a partial write current $I_{WRT}$ of the doubled write current $2I_{WRT}$ may flow toward the upper word line WL3 in the upper tile group UTG along the bit line BL3 and the remaining write current $I_{WRT}$ may flow toward the lower word line WL2051 in the lower tile group LTG along the bit line BL3. Accordingly, data may be simultaneously written or substantially simultaneously written in a memory cell arranged in an intersection region of the bit line BL3 and the word line WL3 and a memory cell arranged in an intersection region of the bit line BL3 and the word line WL2051.

Since a distance from the column decoder Y-Dec to the intersection region of the word line WL3 and the bit line BL3 is substantially the same as a distance from the column decoder Y-Dec to the intersection region of the word line WL2051 and the bit line BL3 as described above, the resistances values may be the same as each other or substantially the same as each other. Accordingly, the write current $I_{WRT}$ flowing toward the word line WL3 may be substantially the same as the write current $I_{WRT}$ flowing toward the word line WL2051.

After the processor 210 transmits the simultaneous write command for the first write command CMD1 and the second write command CMD2 to the memory apparatus 100, the processor 210 may delete write commands in which the simultaneous write operation is performed from the command queue 220 and rearrange the order of the remaining write commands in the command queue 220.

Figure 9:
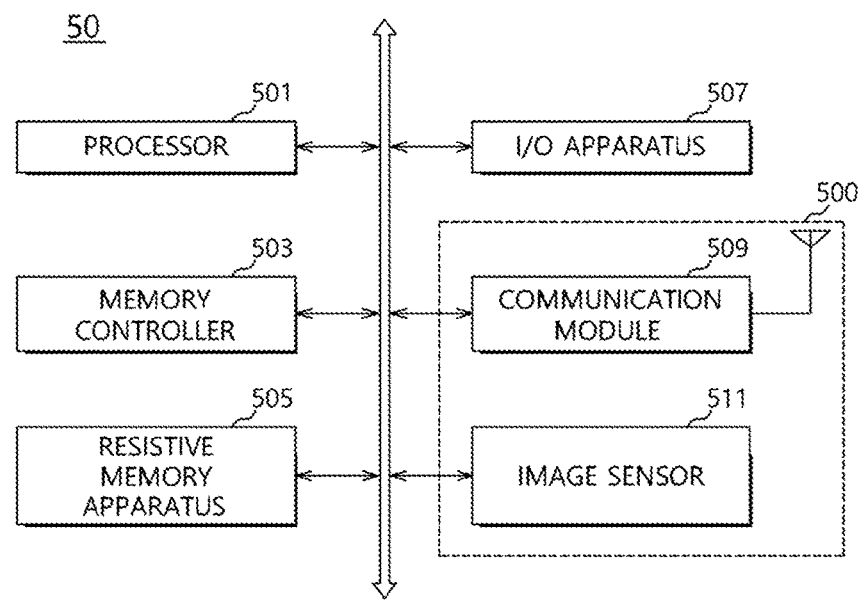
FIG. 9 is a block diagram illustrating an example of a representation of an electronic system employing a memory system according to an embodiment of the present technical spirit.

FIG. 9 is a block diagram illustrating an example of a representation of an electronic system employing a memory system according to an embodiment of the present technical spirit.

Referring to FIG. 9, an electronic system 50 may include a processor 501, a memory controller 503, a resistive memory apparatus 505, an input/output (I/O) apparatus 507, and a function module 500.

The memory controller 503 may control a data processing operation of the resistive memory apparatus 505, for example, a write operation, a read operation, and the like according to control of the processor 501. In an embodiment, the memory controller 503 may be the memory controller 200 illustrated in FIG. 1 and may determine whether or not write commands which can be simultaneously performed are presented among write commands received from a host apparatus (not illustrated) and control the resistive memory apparatus 505 to perform the write operation on one memory cell or to simultaneously perform the write operation on a plurality of memory cells according to the determination result.

Data programmed in the resistive memory apparatus 505 may be output through the I/O apparatus 507 according to control of the processor 501 and the memory controller 503. For example, the I/O apparatus 507 may include a display apparatus, a speaker apparatus, and the like.

The I/O apparatus 507 may also include an input apparatus, and the I/O apparatus 507 may input a control signal for controlling an operation of the processor 501 or data to be processed in the processor 501 through the input apparatus.

In an embodiment, the memory controller 503 may be implemented with a portion of the processor 501 or a separate chipset from the processor 501.

The resistive memory apparatus 505 may include, for example, a memory region configured of a resistive memory device, an address decoder, a controller, a voltage generator, and the like. In an embodiment, the resistive memory apparatus 505 may be the resistive memory apparatus 100 illustrated in FIG. 1. The resistive memory apparatus 505 may be configured to simultaneously perform the write operation on a plurality of memory cells coupled to one bit line according to control of the memory controller 503.

The function module 500 may be a module which may perform a function selected according to an application example of the electronic system 50 illustrated in FIG. 9, and a communication module 509 and an image sensor 511 as an example of the function module 500 are illustrated in FIG. 9.

The communication module 509 may provide a communication environment that the electronic system 50 is coupled to a wired or wireless communication network to exchange data and a control signal.

The image sensor 511 may convert an optical image to digital image signals and transfer the digital image signals to the processor 501 and the memory controller 503.

When the function module 500 includes the communication module 509, the electronic system 50 of FIG. 9 may be a portable communication apparatus such as a wireless communication terminal. When the function module 500 may include the image sensor 511, the electronic system 50 may be a digital camera, a digital camcorder, or an electronic system (for example, a personal computer (PC), a laptop computer, a mobile communication terminal, and the like) to which any one of the digital camera and the digital camcorder is attached.

Figure 10:
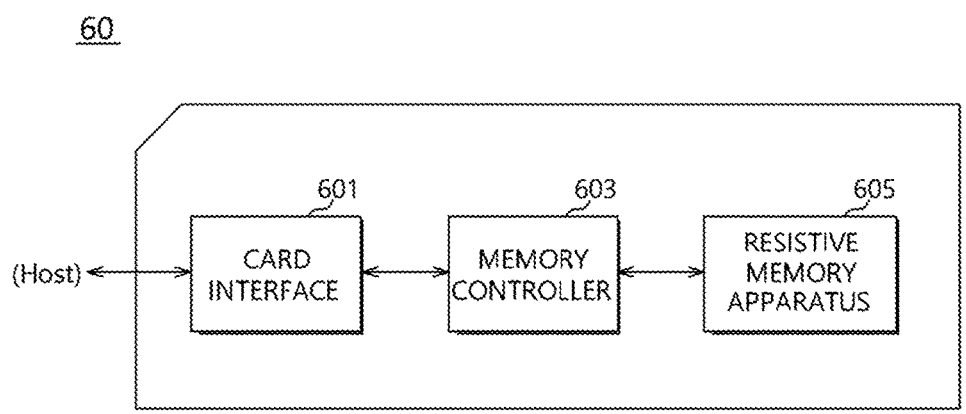
FIG. 10 is a block diagram illustrating an example of a representation of a memory card system employing a memory system according to an embodiment of the present technical spirit.

FIG. 10 is a block diagram illustrating an example of a representation of a memory card system employing a memory system according to an embodiment of the present technical spirit.

Referring to FIG. 10, a memory card system 60 may include a card interface 601, a memory controller 603, and a resistive memory apparatus 605.

FIG. 10 is an illustrative diagram illustrating the memory card system 60 used as a memory card or a smart card, and the memory card system 60 illustrated in FIG. 10 may be any one among a PC card, a multimedia card, an embedded multimedia card, a secure digital card, and a universal serial bus (USB) drive.

The card interface 601 may perform interacting on data exchange between a host and the memory controller 603 according to a protocol of the host. In an embodiment, the card interface 601 may refer to hardware which may support a protocol used in the host, software installed in the hardware which may support the protocol used in the host, or a signal transmission method.

The memory controller 603 may control data exchange between the resistive memory apparatus 605 and the card interface 601. The memory controller 603 may be the memory controller 200 illustrated in FIG. 1 and may determine whether or not write commands which can be simultaneously performed are presented among write commands received from the host and control the resistive memory apparatus 605 to simultaneously perform the write operation on a plurality of memory cells coupled to one bit line according to the determination result.

The memory apparatus 100 illustrated in FIG. 1 may be used for the resistive memory apparatus 605. The resistive memory apparatus 605 may be configured to simultaneously perform the write operation on a plurality of memory cells coupled to one bit line according to control of the memory controller 603.

The above embodiments are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A memory system comprising:
 a memory apparatus including a write driver configured to output a write current for writing data in a plurality of memory cells; and
 a memory controller configured to control the memory apparatus,
 wherein the memory controller includes:
 a command comparison circuit configured to compare word line addresses, bit line addresses, and pieces of write data of a first write command and a second write command received by the memory controller and output a simultaneous write control signal having a first level when the bit line addresses are the same as each other, the pieces of write data are the same as each other and most significant bits (MSBs) of the word line addresses are different from each other; and
 a processor configured to transfer a simultaneous write command for simultaneously operating the first write command and the second write command to the memory apparatus when the simultaneous write control signal having the first level is output from the command comparison circuit, and
 wherein the write driver increases the write current by receiving the simultaneous write control signal having the first level and outputs an increased write current.

2. The memory system of claim 1, wherein the write driver includes:
 a voltage supply terminal;
 a first current source and a second current source coupled in parallel to the voltage supply terminal; and
 a switching element configured to electrically couple the voltage supply terminal and the second current source, and
 the switching element is turned on when the simultaneous write control signal output from the command comparison circuit has the first level and turned off when the simultaneous write control signal has a second level.

3. The memory system of claim 1, wherein the memory apparatus includes a memory cell array configured of a plurality of bit lines and a plurality of word lines,
 the memory cell array includes a plurality of cell regions, and
 each cell region includes:
 an upper tile group and a lower tile group;
 a column decoder arranged between the upper tile group and the lower tile group and coupled to central portions of the plurality of bit lines; and
 a row decoder arranged to cross the upper tile group and the lower tile group and coupled to central portions of the plurality of word lines, wherein the write driver outputs the increased write current to the column decoder.

4. The memory system of claim 3, wherein the increased write current output from the write driver is distributed to the upper tile group and the lower tile group in the column decoder.

5. The memory system of claim 3, wherein the plurality of word lines include upper word lines arranged in the upper tile group and lower word lines arranged in the lower tile group.

6. The memory system of claim 5, wherein addresses of the upper word lines are arranged in ascending order and addresses of the lower word lines are arranged in descending order.

7. The memory system of claim 1, wherein the memory controller further includes a command queue configured to queue commands received from a host apparatus.

8. The memory system of claim 7, wherein the processor transmits the simultaneous write command to the memory apparatus and then deletes the first write command and the second write command from the command queue and rearranges an order of commands remaining in the command queue.

9. The memory system of claim 7, wherein the command comparison circuit compares the first and second write commands among write commands queued in the command queue by selecting the first and second write commands in queued order or by randomly selecting the first and second write commands.

10. The memory system of claim 1, wherein the command comparison circuit includes:
 a first comparison operation block including a plurality of comparison circuits configured to compare a first word line address, a first bit line address, and first write data for the first write command with a second word line address, a second bit line address, and second write data for the second write command; and a second comparison operation block configured to compare comparison results of the plurality of comparison circuits in the first comparison operation block.

11. The memory system of claim 10, wherein the plurality of comparison circuits in the first comparison operation block include:

a first comparison circuit configured to perform a logic operation on the MSB of the first word line address of the first write command and the MSB of the second word line address of the second write command and output an operation result;

a second comparison circuit configured to perform a logic operation on all bits of the first bit line address of the first write command and all bits of the second bit line address of the second write command and output an operation result; and a third comparison circuit configured to perform a logic operation on the first write data of the first write command and the second write data of the second write command and output an operation result.

12. The memory system of claim 11, wherein the second comparison circuit includes:

a first stage configured to perform logic operations on all the bits of the first bit line address of the first write command and all the bits of the second bit line address of the second write command and output operation results; and a second stage configured to perform a logic operation on the operation results output from the first stage and output the operation result.

13. The memory system of claim 12, wherein the first comparison circuit is configured to perform an exclusive OR operation, the first stage of the second comparison circuit and the third comparison circuit are configured to perform an exclusive NOR operation, and the second stage of the second comparison circuit and the second comparison operation block are configured to perform an AND operation.

14. The memory system of claim 10, wherein the plurality of comparison circuits in the first comparison operation block include:

a first comparison circuit configured to perform a logic operation on all bit of the first word line address of the first write command and all bits of the second word line address of the second write command and output an operation result;

a second comparison circuit configured to perform a logic operation on all bits of the first bit line address of the first write command and all bits of the second bit line address of the second write command and output an operation result; and a third comparison circuit configured to perform a logic operation on the first write data of the first write command and the second write data of the second write command and output an operation result.

15. The memory system of claim 14, wherein the first comparison circuit includes:

a first stage configured to perform logic operations on all the bits of the first word line address of the first write command and all the bits of the second word line address of the second write command and output operation results; and a second stage configured to perform a logic operation on the operation results output from the first stage and output the operation result.

16. The memory system of claim 15, wherein the first stage of the first comparison circuit includes:

a first logic gate configured to perform a logic operation on the MSB of the first word line address and the MSB of the second word line address; and a second logic gate configured to perform a logic operation on other bits other than the MSB of the first word line address and other bits other than the MSB of the first word line address.

17. The memory system of claim 16, wherein the first logic gate is configured to perform an exclusive OR operation and the second logic gate is us configured to perform an exclusive NOR operation.

18. A memory system comprising:

a memory cell region including a plurality of bit lines, a plurality of word lines, and a column decoder coupled to central portions of the plurality of bit lines;

a write driver configured to output a write current to the column decoder of the memory cell region;

a control logic configured to control the write driver to write data in the memory cell region;

a command comparison circuit configured to compare word line addresses, bit line addresses, and pieces of write data of a first write command and a second write command received by the command comparison circuit and output a simultaneous write control signal having a first level when the bit line addresses are the same as each other, the pieces of write data are the same as each other and most significant bits (MSBs) of the word line addresses are different from each other; and a processor configured to transfer a simultaneous write command for simultaneously operating the first write command and the second write command to the control logic when the simultaneous write control signal having the first level is output from the command comparison circuit, wherein the write driver increases the write current based on the simultaneous write control signal having the first level output from the command comparison circuit and outputs an increased write current to the column decoder.

19. A memory system comprising:

A memory apparatus including a write driver configured to output a write current for writing data in a plurality of memory cells, and to control the write current based on a simultaneous write control signal; and A memory controller configured to control the memory apparatus, and to compare word line addresses, bit line addresses with each other, pieces of write data of a first write command and a second write command received by the memory controller and output the simultaneous write control signal having a first level after comparing the bit line addresses and the pieces of write data with each other and most significant bits (MSBs) of the word line addresses with each other.

20. The memory system of claim 19, wherein the write current is increased when the bit line addresses are the same as each other, the pieces of write data are the same as each other and MSBs of the word line addresses are different from each other.

* * * * *